US012720966B2

(12) United States Patent
Wang et al.

(10) Patent No.: US 12,720,966 B2
(45) Date of Patent: Aug. 25, 2026

(54) DISPLAY PANEL, DISPLAY DEVICE, AND MANUFACTURING METHOD FOR DISPLAY PANEL

(71) Applicants: Chengdu BOE Optoelectronics Technology Co., Ltd., Chengdu (CN); BOE Technology Group Co., Ltd., Beijing (CN)

(72) Inventors: Yulin Wang, Beijing (CN); Yide Du, Beijing (CN); Jiandong Bao, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 342 days.

(21) Appl. No.: 18/697,446

(22) PCT Filed: Jun. 20, 2023

(86) PCT No.: PCT/CN2023/101504
§ 371 (c)(1),
(2) Date: Mar. 29, 2024

(87) PCT Pub. No.: WO2023/246810
PCT Pub. Date: Dec. 28, 2023

(65) Prior Publication Data

US 2025/0056972 A1 Feb. 13, 2025

(30) Foreign Application Priority Data

Jun. 24, 2022 (CN) ......................... 202210722798.5

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/8723* (2023.02); *H10K 2102/351* (2023.02)

(58) Field of Classification Search
CPC ............... H10K 59/00; H10K 59/1201; H10K 59/8723; H10K 59/122; H10K 59/124; H10K 2102/351
(Continued)

(56) References Cited

U.S. PATENT DOCUMENTS 9,966,566 B2 * 5/2018 Shin .................. G02F 1/133377
10,205,122 B2 * 2/2019 Choi .................... H10K 59/124
(Continued)

FOREIGN PATENT DOCUMENTS

CN 111162196 A 5/2020
CN 210535696 U 5/2020
(Continued)

*Primary Examiner* — Pritham D Prabhakher
(74) *Attorney, Agent, or Firm* — IPro, PLLC

(57) ABSTRACT

Provided is a display panel. The display panel includes: a base provided with a display region, a hole region, and an isolation region disposed between the display region and the hole region. The display region and the isolation region at least partially surround the hole region. The display panel includes: a planarization layer disposed on the base, a pixel defining layer and a spacer layer which are disposed on the planarization layer, and an inorganic material layer covering the planarization layer, the pixel defining layer and the spacer layer. The isolation region is provided with at least one blocking groove and at least one blocking wall. The blocking groove is formed in the planarization layer, and the blocking wall includes the planarization layer and the inorganic material layer formed on the planarization layer.

17 Claims, 4 Drawing Sheets

(51) Int. Cl.
*H10K 59/80* (2023.01)
*H10K 102/00* (2023.01)

(58) Field of Classification Search
USPC ........................................................ 257/79
See application file for complete search history.

(56) References Cited

U.S. PATENT DOCUMENTS

| | | | | |
|---|---|---|---|---|
| 10,566,394 | B2* | 2/2020 | Cai | H10K 59/124 |
| 11,411,059 | B2* | 8/2022 | Cheng | H10K 59/8722 |
| 12,200,957 | B2* | 1/2025 | Ochi | H10K 59/122 |
| 12,256,608 | B2* | 3/2025 | Jin | H10K 59/131 |
| 2007/0188093 | A1* | 8/2007 | Nagara | H10K 59/173<br>313/504 |
| 2016/0336541 | A1* | 11/2016 | Kim | H10D 86/441 |
| 2017/0148856 | A1* | 5/2017 | Choi | H10K 59/873 |
| 2017/0207418 | A1* | 7/2017 | Shin | G02F 1/133377 |
| 2018/0061910 | A1* | 3/2018 | Cai | H10K 59/131 |
| 2018/0124933 | A1* | 5/2018 | Park | G09G 3/22 |
| 2018/0151850 | A1* | 5/2018 | Lee | H10K 59/88 |
| 2019/0165312 | A1* | 5/2019 | Bae | G09G 3/20 |
| 2019/0288231 | A1* | 9/2019 | He | H10K 59/122 |
| 2020/0203660 | A1* | 6/2020 | Shi | H10K 59/873 |
| 2021/0005686 | A1* | 1/2021 | Cheng | H10K 59/122 |
| 2022/0085330 | A1* | 3/2022 | Yang | H10K 59/873 |
| 2022/0173185 | A1* | 6/2022 | Jin | H10K 59/123 |
| 2022/0190289 | A1 | 6/2022 | Ochi et al. | |
| 2024/0206303 | A1* | 6/2024 | Sun | H10K 59/8791 |

FOREIGN PATENT DOCUMENTS

| | | | |
|---|---|---|---|
| CN | 111509024 | A | 8/2020 |
| CN | 113410414 | A | 9/2021 |
| CN | 115084411 | A | 9/2022 |

* cited by examiner

DISPLAY PANEL, DISPLAY DEVICE, AND MANUFACTURING METHOD FOR DISPLAY PANEL

CROSS-REFERENCE TO RELATED APPLICATION

The present disclosure a U.S. national stage of international application No. PCT/CN2023/101504, field on Jun. 20, 2023, which claims priority to Chinese Patent Application No. 202210722798.5, filed on Jun. 24, 2022, and entitled "DISPLAY PANEL, DISPLAY DEVICE, AND MANUFACTURING METHOD FOR DISPLAY PANEL", the entire contents of which are herein incorporated by reference.

TECHNICAL FIELD

The present disclosure relates to the field of display technologies, and in particular, relates to a display panel, a display device, and a method for manufacturing the display panel.

BACKGROUND

In the field of photoelectric display technology, organic light emitting diodes (OLED) have many advantages such as active illumination, high brightness, high contrast, ultra-thin, low power consumption, flexibility and wide working temperature range, and are an advanced new mainstream flat panel display technology.

SUMMARY

For solving at least one of the above problems, one or more embodiments of the present disclosure provide a display panel, a display device, and a method for manufacturing the display panel.

One or more embodiments of the present disclosure provide display panel. The display panel includes a base provided with a display region, a hole region, and an isolation region disposed between the display region and the hole region, the display region and the isolation region at least partially surrounding the hole region;

- the display panel includes a planarization layer disposed on the base, a pixel defining layer and a spacer layer which are disposed on the planarization layer, and an inorganic material layer covering the planarization layer, the pixel defining layer and the spacer layer;
- wherein the isolation region is provided with at least one blocking groove and at least one blocking wall, wherein the blocking groove is formed in the planarization layer, and the blocking wall includes the planarization layer and the inorganic material layer formed on the planarization layer.

In some embodiments, the blocking groove includes a first blocking groove and a second blocking groove; wherein

- the inorganic material layer covers a surface of the second blocking groove and has a hollow at the first blocking groove.

In some embodiments, the planarization layer includes a first planarization layer and a second planarization layer that are stacked, wherein at least one first blocking groove penetrates through the second planarization layer.

In some embodiments, the pixel defining layer and the spacer layer are disposed in a same layer and are made of a same material, and in a direction perpendicular to a surface of the base, a thickness of the pixel defining layer is less than a thickness of the spacer layer.

In some embodiments, the pixel defining layer and the spacer layer are made of an opaque material.

In some embodiments, in constituent structures of the blocking wall, an orthographic projection of the planarization layer on the base is within an orthographic projection of the inorganic material layer on the base.

In some embodiments, the blocking wall includes a first blocking wall; wherein the first blocking wall is disposed between the first blocking groove and the second blocking groove, and covers an edge of a side, close to the hole region, of the second planarization layer.

In some embodiments, at least one of a side surface of the blocking wall facing the display region and a side surface of the blocking wall facing away from the display region is a curved surface recessed towards a center of the blocking wall.

In some embodiments, the display panel includes a plurality of blocking walls, wherein surfaces of the plurality of blocking walls away from the base have a same height relative to the base.

In some embodiments, the display panel further includes an anode layer disposed on the planarization layer, wherein the pixel defining layer and the inorganic material layer are provided with openings in the display region for exposing the anode layer in the openings.

In some embodiments, the display panel includes a gate, a source and a drain which are disposed on the base, and the isolation region is provided with at least one of a first metal wiring layer which is disposed in a same layer as the gate and a second metal wiring layer which is disposed in a same layer as the source and the drain, wherein an orthographic projection of the first planarization layer on the base covers an orthographic projection of at least one of the first metal wiring layer and the second metal wiring layer on the base.

In some embodiments, the inorganic material layer is made of one or more of $SiN_x$, $SiO_x$, SiON, and $Al_2O_3$.

Based on the same inventive concepts, one or more embodiments of the present disclosure further provide a method for manufacturing a display panel. The method includes:

- forming a pixel defining layer and a spacer layer on a planarization layer disposed on a base;
- forming an inorganic material layer on the acquired structure;
- patterning the inorganic material layer to remove the inorganic material layer in a hole region and at a position where a blocking groove is to be formed; and
- etching the acquired structure to form a blocking wall and a first blocking groove in an isolation region.

In some embodiments, the pixel defining layer and the spacer layer are made of an opaque material.

In some embodiments, etching the acquired structure to form the blocking wall and the first blocking groove in the isolation region includes:

- applying a photoresist to the acquired structure and etching the acquired structure to form the blocking wall and the first blocking groove in the isolation region, and stripping the photoresist, which includes stripping the photoresist with a stripping solution.

Based on the same inventive concepts, one or more embodiments of the present disclosure further provide a display device, including the display panel in the above aspect.

DETAILED DESCRIPTION

Figure 1:
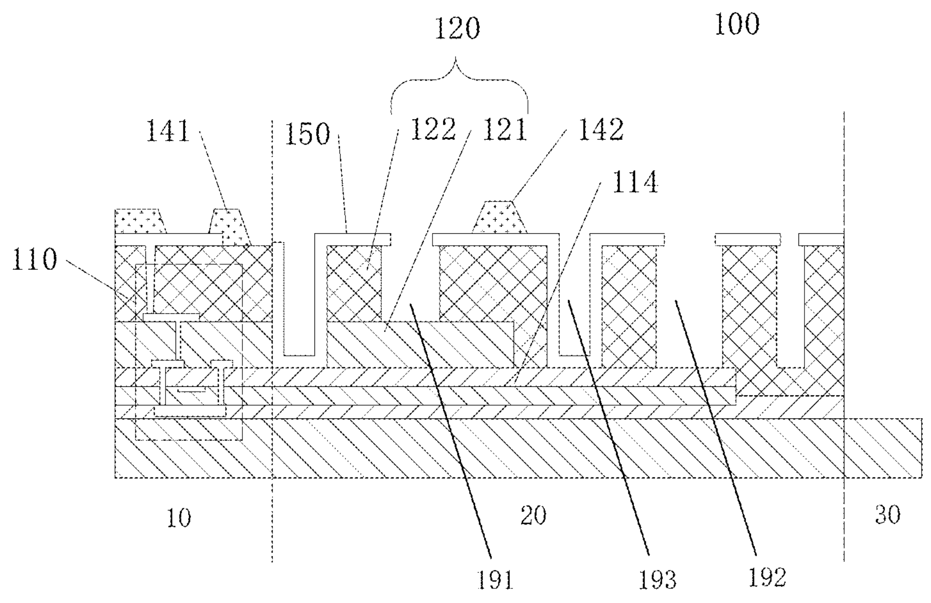
FIG. 1 shows a structural block diagram of a display panel in the related art.

For a clearer description of the present disclosure, the present disclosure will be further described below with reference to the embodiments and accompanying drawings. Similar elements in the drawings are denoted by the same reference numerals. Those skilled in the art should understand that the contents specifically described below are illustrative but not restrictive, and shall not limit the protection scope of the present disclosure.

It should be noted that "on . . . ", "formed on . . . ", and "disposed on . . . " described herein mean that one layer is directly formed or disposed on another layer, or mean that one layer is indirectly formed or disposed on another layer, that is, another layer exists between the two layers. In this text, unless otherwise specified, the term "disposed in the same layer" means that two layers, parts, components, elements or portions are formed by one patterning process, and the two layers, parts, components, elements or portions are generally made of the same material. In the present disclosure, unless otherwise specified, the expression "patterning process" generally includes steps of photoresist coating, exposure, developing, etching, and photoresist stripping. The expression "one patterning process" refers to a process of forming patterned layers, parts, components, and the like using one mask.

For a product in which an opening for a camera, a sensor and the like is provided in a display screen, a blocking wall and a groove structure are usually arranged around the opening to improve the reliability of the display panel. However, the forming process of the blocking wall and the groove structure may affect the encapsulation of the device, so that the OLED display panel has the problems of display defects, a short service life and the like.

FIG. 1 schematically shows a display panel 100 in the related art. The display panel 100 is provided with a display region 10, a hole region 30, and an isolation region 20 disposed between the display region 10 and the hole region 30. The display region 10 is configured for display, and is provided with structures such as pixel units. The hole region 30 is configured to provide a working space for components such as a camera and a sensor, and is not provided with a circuit structure. For example, the hole region 30 includes a closed hole, and the hole region 30 is surrounded by the display region 10 and the isolation region 20. For another example, the hole region 30 includes an opened hole, and the hole region 30 is partially surrounded by the display region 10 and the isolation region 20. In FIG. 1, the hole region 30 is close to the edge of the display panel.

A film layer structure 110 for implementing a display function and other functions is provided on the substrate in the display region 10 of the display panel 100. The film layer structure 110 may be, for example, an anode layer related to organic light emission, and a channel layer, a gate layer, a gate insulating layer, and a source and drain layer and the like related to a thin film transistor. To simplify the structure shown, these film layer structures are represented by the film layer structure 110. Further, in addition to the functional film layer structures, an interlayer insulating layer 114, a planarization layer 120, an inorganic material layer 150, and a pixel defining layer 141 and a spacer layer 142 which are disposed on the inorganic material layer are sequentially provided from bottom to top on the substrate in the display region 10 and the isolation region 20. The planarization layer 120 includes a first planarization layer 121 and a second planarization layer 122.

A blocking wall and a blocking groove are disposed in the isolation region 20. The blocking groove includes a first blocking groove 191 formed at the bottom of the planarization layer 120 and exposing the planarization layer 120, a second blocking groove 192 penetrating through the planarization layer 120 and exposing the interlayer insulating layer 114, and a third blocking groove 193 penetrating through the planarization layer 120 and having the inorganic material layer 150 formed on the surface thereof. The blocking walls are disposed between the above blocking grooves. The blocking walls include the planarization layer 120 and the inorganic material layer 150 disposed on the planarization layer 120. The pixel defining layer 141 is disposed in the display region 10, and the spacer layer 142 which is disposed in the same layer as the pixel defining layer 141 is disposed on the blocking wall in the isolation region 20.

For the display panel shown in FIG. 1, the blocking wall structure in the isolation region 20 is configured to cut off the continuity of the film layers such as the organic light-emitting layer and the cathode, so that the encapsulation film layer achieves effective encapsulation on the side to improve the reliability of the display panel. Because the blocking wall and blocking groove disposed in the planarization layer 120 have a narrower border and a deeper groove, the display panel has better performance and product competitiveness. However, the deeper groove causes the problem that the coating process cannot be performed after the blocking wall is formed, so the process for forming the blocking wall in the planarization layer must be completed after the process steps for forming the pixel defining layer and the spacer layer, and meanwhile, the material for forming the pixel defining layer and the spacer layer must be able to bear the stripping solution used in the stripping process after the process for forming the blocking wall.

For the above problems of the display panel, one or more embodiments of the present disclosure provide a display panel, including a base having a display region, a hole region, and an isolation region disposed between the display region and the hole region, and the display region and the isolation region at least partially surround the hole region.

The display panel includes a planarization layer disposed on the base, a pixel defining layer and a spacer layer which are disposed on the planarization layer, and an inorganic material layer covering the planarization layer, the pixel defining layer and the spacer layer.

The isolation region is provided with at least one blocking groove and at least one blocking wall. The blocking groove is formed in the planarization layer, and the blocking wall includes the planarization layer and the inorganic material layer formed on the planarization layer.

In the embodiments of the present disclosure, the inorganic material layer covers the pixel defining layer and the spacer layer, which can prevent the stripping process from damaging the pixel defining layer and the spacer layer in the patterning process of forming the blocking groove and the blocking wall.

Figure 2:
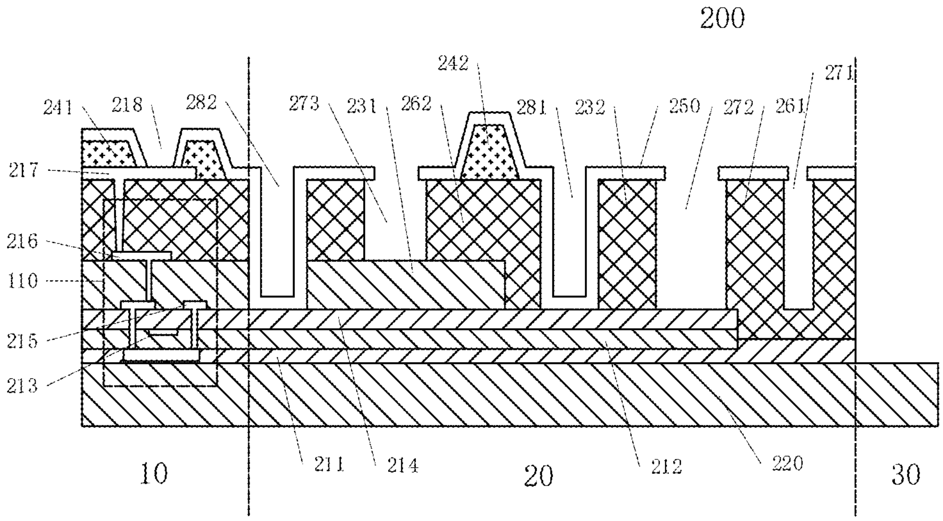
FIG. 2 shows a structural block diagram of a display panel according to some embodiments of the present disclosure.

As shown in FIG. 2, the display panel 200 is provided with a display region 10, a hole region 30, and an isolation region 20 disposed between the display region and the hole region. The display region is configured for display, and is provided with structures such as pixel units. The hole region is configured to provide a working space for components such as a camera and a sensor, and is not provided with a circuit structure. For example, the hole region includes a closed hole surrounded by the isolation region and the display region. For another example, the hole region includes an opened hole partially surrounded by the isolation region and the display region. In some embodiments, the hole region 30 is close to an edge of the display panel.

In one or more embodiments, the display panel 200 includes: a base substrate 220 on which a film layer structure for implementing a display function and other functions is provided in the display region 10 of the display panel, wherein the film layer structure is denoted by 110 for convenience; a first planarization layer 231 and a second planarization layer 232; an anode disposed on the second planarization layer 232; a pixel defining layer 241 disposed on the second planarization layer 232; and an inorganic material layer 250 covering the second planarization layer 232 and the pixel defining layer 241. The inorganic material layer 250 exposes the anode such that the anode is in contact with a light-emitting layer material.

Exemplarily, in some embodiments, the film layer structure 110 related to the thin film transistor and disposed on the base in the display region 10 includes an active layer 211, a gate insulating layer 212, a gate layer 213, an interlayer insulating layer 214, a source and drain layer 215, a metal wiring layer 216, and an anode electrode layer 217 which are formed on the base substrate, for example, the substrate 220. The first planarization layer 231 is disposed between the source and drain layer and the metal wiring layer, and the second planarization layer 232 is disposed between the metal wiring layer 216 and the anode electrode layer 217. The first planarization layer 231 and the second planarization layer 232 are configured to protect the electrode layers and metal wiring layers from being broken due to process steps, thereby improving the process stability and reliability of the display panel. The isolation region 20 is disposed between the display region 10 and the hole region 30, and is configured to isolate the display region from the hole region and also used as a bonding region of the display panel.

In some embodiments, at least a portion of the isolation region 20 on the base substrate is provided with: a functional layer, e.g., a first metal wiring layer disposed in the same layer as the gate, and/or a second metal wiring layer disposed in the same layer as the source and the drain, and an insulating layer disposed between the metal wiring layers; a planarization layer disposed on the functional layer, wherein an orthographic projection of the planarization layer on the base covers an orthographic projection of the first metal wiring layer on the base and/or an orthographic projection of the second metal wiring layer on the base; an inorganic material layer 250 disposed on the planarization layer; and a spacer layer 242 disposed between the planarization layer and the inorganic material layer and configured to provide support.

In some embodiments, at least a partial region of the planarization layer includes the first planarization layer 231 and the second planarization layer 232, and the other region of the planarization layer includes the second planarization layer 232. At least one blocking wall and at least one blocking groove are disposed in the isolation region 20. The blocking wall is configured to support and protect various film layer structures in the display panel, for example, configured to prevent the metal wiring layers from being eroded by external pollutants such as water vapor, and limit the flow range of the solution in the evaporation or encapsulation process. The blocking groove is configured to cut off the continuity of film layers such as the organic encapsulation layer and the cathode, thereby improving the reliability of effective encapsulation.

In some embodiments, as shown in FIG. 2, a first blocking wall 261 is disposed on the side of the isolation region 20 close to the hole region 30, and the isolation region 20 is provided with a first blocking groove 271, a second blocking groove 272 and a third blocking groove 273. The first blocking wall 261 includes the planarization layer and the inorganic material layer 250 on the planarization layer, and the first blocking groove 271, the second blocking groove 272 and the third blocking groove 273 are disposed in the planarization layer.

In some embodiments, in the case that the planarization layer is disposed on the functional layer, for example, in the case that the planarization layer is disposed on the interlayer insulating layer 214, the second blocking groove 272 is disposed in the planarization layer, with the interlayer insulating layer 214 as a bottom.

In some embodiments, the planarization layer includes a first planarization layer 231 and a second planarization layer 232 which are configured to protect the metal wiring layer disposed therebetween, to avoid breakage of the metal wiring layer due to process steps. In this case, the third blocking groove 273 is disposed in the second planarization layer 232, with the first planarization layer 231 as a bottom. Although the blocking grooves shown in the drawings have the same depth, in some embodiments, the blocking grooves have different depths as required, and the upper surface of the planarization layer has the same height relative to the base. When an organic thin film encapsulation is performed on the display panel, the blocking walls and blocking grooves can increase the contact area between the thin film encapsulation and the blocking walls, such that the organic encapsulation layer flows more fully in the leveling process, and local accumulation in the hole region is alleviated.

In some embodiments, as shown in FIG. 2, a second blocking wall 262 is disposed on the side of the isolation region 20 close to the display region 10, and the isolation region 20 is provided with a fourth blocking groove 281 and a fifth blocking groove 282. The fourth blocking groove 281 and the fifth blocking groove 282 are disposed in the planarization layer, and an inorganic material layer is formed on the bottom surfaces and side walls of the fourth blocking groove 281 and the fifth blocking groove 282. The inorganic material layer is disposed in the same layer as the inorganic material layer formed on the second blocking wall, the pixel defining layer and the spacer layer, and is configured to protect each functional layer in the display region and each functional layer extending into the isolation region, such that each functional layer is isolated from components such as water and oxygen that may exist in subsequent processes, thereby improving the quality of the display panel.

In some embodiments, the second blocking wall 262 includes the first planarization layer 231, the second planarization layer 232, and the inorganic material layer 250. The second blocking wall has the same height as the first blocking wall. The fourth blocking groove 281 penetrates through the second planarization layer 232, with the interlayer insulating layer 214 as a bottom. In some other embodiments, the fifth blocking groove 282 penetrates through the second planarization layer 232 and the first planarization layer 231, with the interlayer insulating layer 214 as a bottom. In an embodiment in which the third blocking groove 273 and the fourth blocking groove 281 are both provided, the third blocking groove 273 is disposed closer to the display region 10 than the fourth blocking groove 281 is. With this structure, the fourth blocking groove 281 at a position far away from the display region better protects the functional layers in the isolation region and the functional layers in the display region, to prevent the intrusion of components such as water and oxygen. Similarly, the third blocking groove 273 disposed close to the display region cuts off the continuity of the functional layers such as the cathode, thereby further improving the leveling of the display panel provided with the hole region in the encapsulation process, and improving the process reliability of the display panel.

In some embodiments, the planarization layer of the blocking wall has an undercut structure under the inorganic material layer, which can better achieve the function of separating the film layers. Exemplarily, in the process of forming the blocking groove, the planarization layer of the blocking wall forms an internal contracting structure due to over-etching.

In some embodiments, in the constituent structures of the blocking wall, the orthographic projection of the planarization layer on the base is within the orthographic projection of the inorganic material layer on the base. That is, the orthographic projection of the planarization layer of the blocking wall on the base falls within the orthographic projection of the inorganic material layer on the base, thereby better separating the film layers to prevent the intrusion of water and oxygen, and further improving the encapsulation effect.

In some embodiments, as shown in FIG. 2, the blocking wall includes a second blocking wall 262, and the second blocking wall 262 is disposed between the third blocking groove 273 and the fourth blocking groove 281 and covers the edge of the side, close to the hole region 30, of the second planarization layer 232. Therefore, the film layers are better separated, the intrusion of water and oxygen is prevented, and the encapsulation effect is further improved.

Figure 8:
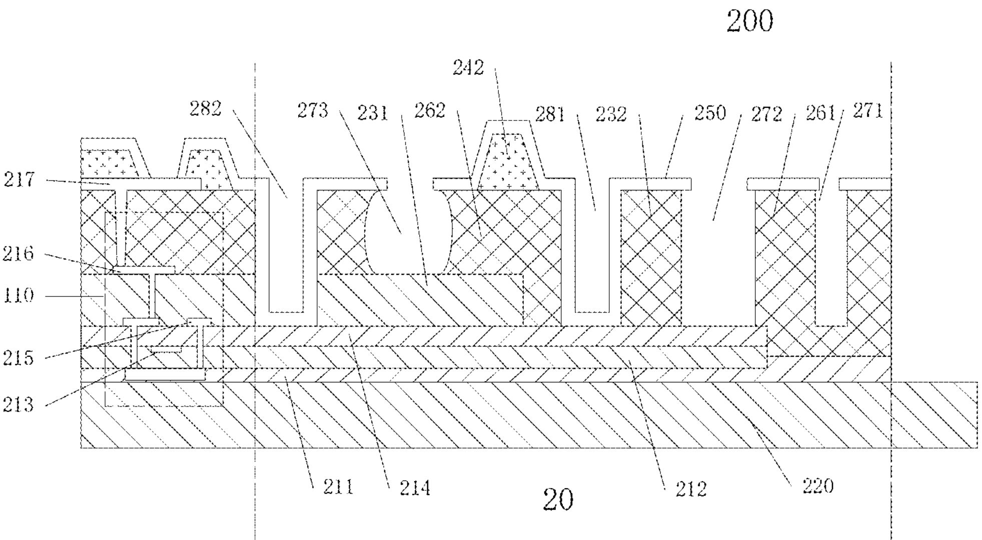
FIG. 8 shows a structural block diagram of a display panel according to some embodiments of the present disclosure.

In some embodiments, as shown in FIG. 8, at least one of the side surface of the blocking wall facing the display region 10 and the side surface of the blocking wall facing away from the display region 10 is a curved surface recessed towards the center of the blocking wall, thereby better separating the film layers to prevent the intrusion of water and oxygen, and further improving the encapsulation effect.

Further, the pixel defining layer 241 includes a plurality of opening regions, i.e., pixel openings 218, which are spaced apart from each other and penetrate the pixel defining layer. Light-emitting units (not shown) are disposed in the pixel openings of the pixel defining layer and above the anode layer. The plurality of light-emitting units are spaced apart from each other in the display region, and adjacent light-emitting units are isolated by the pixel defining layer.

In some embodiments, the spacer layer 242 formed in the isolation region and the pixel defining layer 241 formed in the display region are disposed in the same layer and made of the same material. The height of the side of the spacer layer away from the base is greater than the height of the side of the pixel defining layer away from the base, and the spacer layer is configured to support the encapsulation layer of the display panel.

In some embodiments, the pixel defining layer and the spacer layer are made of an opaque organic material. When the display panel is a color on encapsulation (COE) display panel formed on the encapsulation layer, a color filter is manufactured on the encapsulation layer, which can improve the light transmittance of the display panel and reduce the power consumption of the display panel. However, the increase of the reflectivity of the cathode layer affects the user's experience. In order to reduce the reflectivity of the cathode layer of the COE display panel, in some embodiments, the pixel defining layer made of the opaque material and the spacer layer made of the opaque material are used to replace the transparent pixel defining layer and the transparent spacer layer in the related art, such that the non-pixel points are in a dark state, which can reduce the reflectivity of the cathode layer. In order to ensure that the pixel defining layer made of the opaque material and the spacer layer made of the opaque material are not affected by the stripping solution in the subsequent glass process and ensure the process stability and the reliability of the display panel, in the embodiments of the present disclosure, the pixel defining layer made of the opaque material and the spacer layer made of the opaque material are disposed between the planarization layer and the inorganic material layer, such that the inorganic material layer can protect the pixel defining layer made of the opaque material and the spacer layer made of the opaque material. For example, the pixel defining layer and the spacer layer are black. In some embodiments, the material of the inorganic material layer is selected from at least one of $SiN_x$, $SiO_x$, SiON, $Al_2O_3$, where X is a positive number.

In one or more embodiments of the present disclosure, the inorganic material layer used as a hard mask for forming the blocking wall shown in FIG. 1 is removed, and the inorganic material layer used as the hard mask is deposited after the process of preparing the pixel defining layer made of the opaque material and the spacer layer made of the opaque material is completed; and the inorganic material layer is patterned to remove the inorganic material layer and the planarization layer which are disposed on the surface of the anode to form the inorganic material layer at the position of the blocking groove, and the inorganic material layer on the pixel defining layer made of the opaque material and the spacer layer made of the opaque material is retained, to effectively protect the pixel defining layer made of the opaque material and the spacer layer made of the opaque material and prevent the pixel defining layer made of the opaque material and the spacer layer made of the opaque material from being affected by subsequent processes. A photoresist is coated on the acquired structure and then a developing process is performed. The photoresist is used as a mask and the inorganic material layer is used as a hard mask to etch the planarization layer under the opening in the inorganic material layer in the isolation region, thereby forming a blocking wall and a blocking groove with an undercut partition structure. The remaining photoresist is removed by a stripping process to complete the preparation of the blocking wall and the blocking groove. According to the solution of the present disclosure, on the one hand, the pixel defining layer made of the opaque material and the spacer layer made of the opaque material can be effectively protected by the inorganic material layer formed thereon, thereby preventing the stripping solution from damaging the pixel defining layer made of the opaque material; and on the other hand, the inorganic material layer can also effectively protect the spacer layer, thereby preventing a high-precision mask plate from scratching the spacer layer in an evaporation stage of an organic light-emitting material. Thus, the reliability of the display panel is effectively improved, and the service life of the display panel is prolonged.

Another embodiment of the present disclosure provides a display device, including the above display panel. The display device is an electroluminescent display device, and may be any product or component having a display function, such as a mobile phone, a tablet computer, a television, a display, a notebook computer, a digital photo frame, or a navigator.

Hereinafter, the method for manufacturing the display panel of the present disclosure is further described in detail with reference to embodiments.

Figure 3:
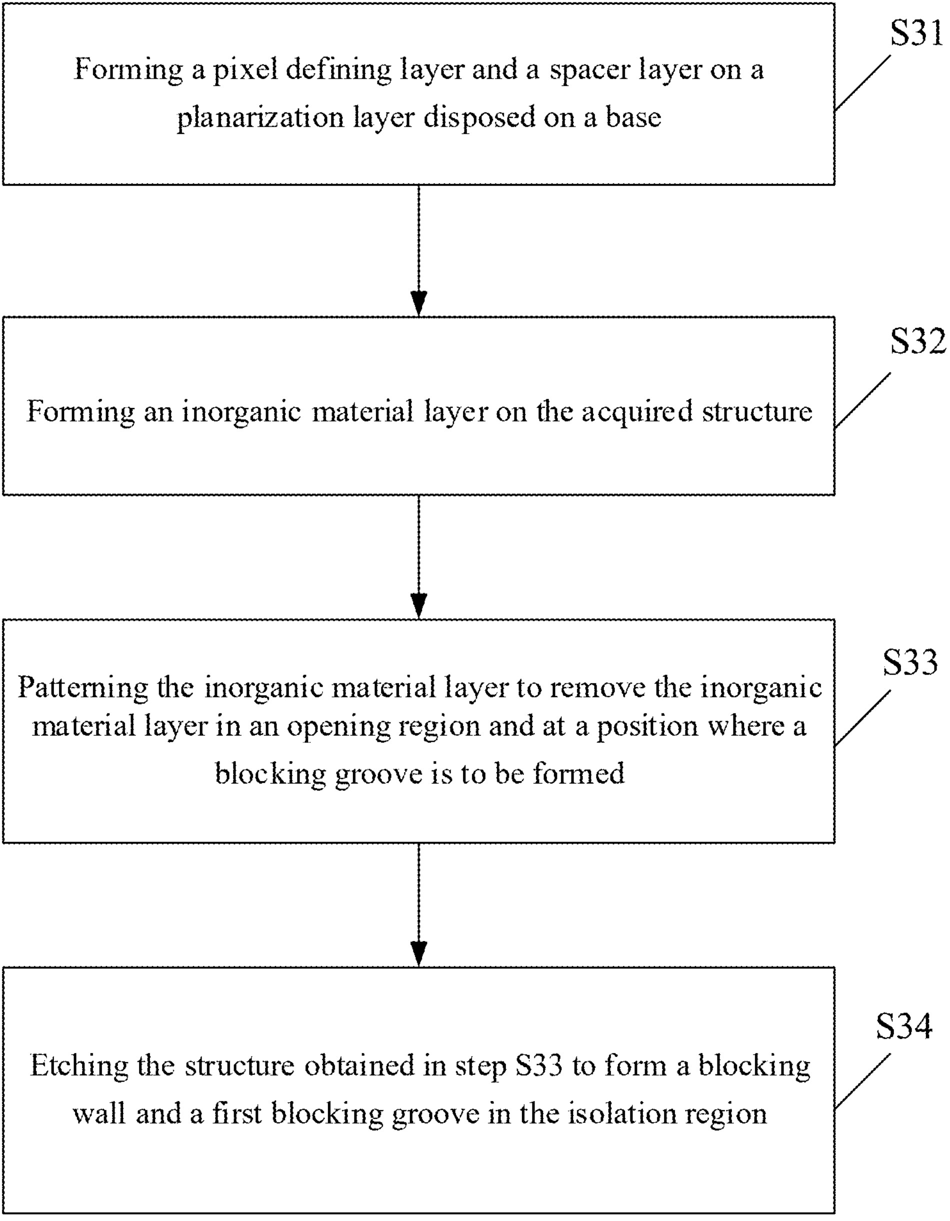
FIG. 3 shows a flowchart of a method for manufacturing a display panel according to some embodiments of the present disclosure.

FIG. 3 illustrates a flowchart of a method for manufacturing a display panel according to some embodiment of the present disclosure.

In S31, a pixel defining layer and a spacer layer are formed on a planarization layer disposed on a base.

Exemplarily, the pixel defining layer and the spacer layer are made of an opaque material.

In S32, an inorganic material layer is formed on the acquired structure.

In S33, the inorganic material layer is patterned to remove the inorganic material layer in an opening region and at a position where a blocking groove is to be formed.

In S34, the structure obtained in step S33 is etched to form a blocking wall and a first blocking groove in the isolation region.

Exemplarily, a photoresist is applied to the acquired structure and the acquired structure is etched to form a blocking wall and a first blocking groove in the isolation region, and the photoresist is stripped. Stripping the photoresist includes stripping with a stripping solution.

According to the embodiments of the present disclosure, in the case that the pixel defining layer and the spacer layer are made of the opaque organic material, since the pixel defining layer and the spacer layer are protected by the inorganic material layer formed thereon, the opaque pixel defining layer and spacer layer are prevented from being eroded by the stripping solution in the stripping process, thereby improving the yield and reliability of the product.

According to the method for manufacturing the display panel of the present disclosure, after the pixel defining layer made of the opaque material and the spacer layer made of the opaque material are formed on the planarization layer disposed on the base, an inorganic material layer used as a hard mask is deposited to protect the pixel defining layer made of the opaque material and the spacer layer made of the opaque material. Then, the inorganic material layer is patterned to obtain an opening exposing the anode and the planarization layer, the photoresist is coated, and the planarization layer under the opening in the inorganic material layer in the isolation region is etched to form the blocking wall and the blocking groove with the undercut partition structure. In this way, the display region and the hole region are isolated perfectly, and the pixel defining layer made of the opaque material and the spacer layer made of the opaque material can be effectively protected, thereby effectively improving the yield of the COE display panel.

An exemplary embodiment of the method for manufacturing the display panel of the present disclosure is described below with reference to FIG. 4 to FIG. 7.

Figure 4:
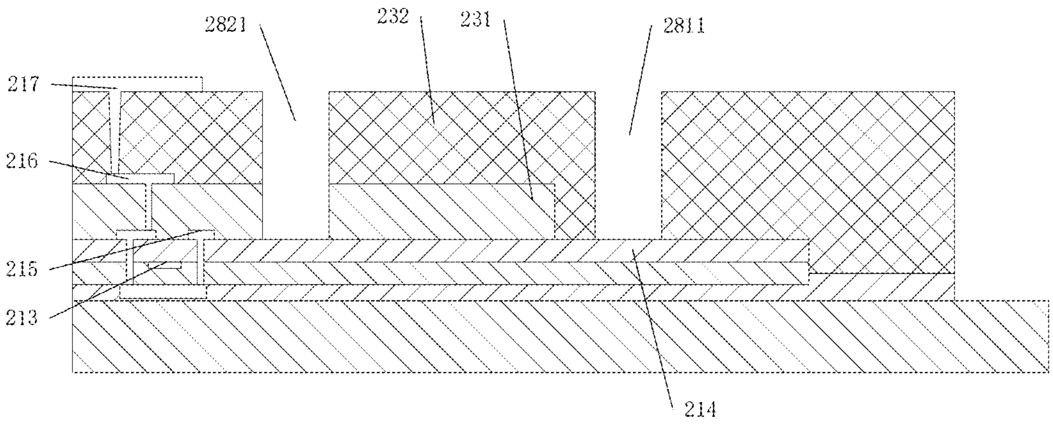
FIG. 4 shows a schematic structural diagram of an intermediate structure formed by related steps of a method for manufacturing a display panel according to some embodiments of the present disclosure.

The base in the present disclosure at least includes a base substrate, a planarization layer on the base substrate, an electrode layer on the planarization layer, and a groove formed in the planarization layer in an isolation region. FIG. 4 exemplarily shows a base structure involved in the method for manufacturing the display panel of the present disclosure.

The display panel of the embodiments of the present disclosure includes an active layer 211, a gate insulating layer 212, a gate layer 213, an interlayer insulating layer 214, a source and drain layer 215, a metal wiring layer 216, and an anode electrode layer 217 which sequentially formed from bottom to top on the base substrate 220. A first planarization layer 231 is disposed between the source and drain layer 215 and the metal wiring layer 216, a second planarization layer 232 is disposed between the metal wiring layer 216 and the anode electrode layer 217, and the first planarization layer and the second planarization layer are configured to protect the various electrode layers and metal wiring layers. The base is divided into a display region 10, a hole region 30, and an isolation region 20 disposed between the display region and the hole region according to function. The display region and the isolation region at least partially surround the hole region. The various electrode layers in the display region 10 are electrically connected through a via hole formed in the insulating layer to form a transistor that drives a display element. An upper surface of the base in the display region includes an upper surface of the second planarization layer and an anode electrode layer disposed on the second planarization layer.

The isolation region 20 is provided with one or more layers of structures that are respectively disposed in the same layer as the functional layers in the display region and extend to the isolation region. For example, a portion of the isolation region is provided with one or more layers of an extension portion of the active layer, an extension portion of the gate insulating layer and a gate wiring layer, an interlayer insulating layer 214, and a first planarization layer 231 and a second planarization layer 232 that are disposed on the interlayer insulating layer; and another portion of the isolation region is provided with a second planarization layer 232 disposed on the interlayer insulating layer. In yet another embodiment, a further portion of the isolation region is provided with a second planarization layer 232 disposed on the active layer. An upper surface of the base in the isolation region includes an upper surface of the second interlayer insulating layer. The isolation region is further provided with at least one groove disposed in the planarization layer. As shown in FIG. 4, the isolation region is provided with two grooves 2811 and 2821. The groove 2811 penetrates through the second planarization layer 232, with the interlayer insulating layer as a bottom; and the groove 2821 penetrates through the second planarization layer 232 and the first planarization layer 231, with the interlayer insulating layer as a bottom. The structure shown in FIG. 4 is an example and non-limiting, and is used to illustrate the method for manufacturing the display panel in the present disclosure. It should be understood that the display panel and the manufacturing method thereof according to the present disclosure are not limited to the base structure shown in FIG. 4.

According to the method provided in the embodiments of the present disclosure, a pixel defining layer and a spacer layer are first formed on a base. The pixel defining layer is disposed in the display region, and a hole region of the pixel defining layer exposes the anode layer. The spacer layer is disposed at a position where a blocking wall is to be formed on the planarization layer in the isolation region, and the acquired structure is as shown in FIG. 5.

Above the base shown in FIG. 4, a pixel defining layer 241 and a spacer layer 242 are formed on the planarization layer by deposition and patterning. The pixel defining layer is disposed on the planarization layer in the display region and includes a plurality of anode openings 218 spaced apart from each other and penetrating through the pixel defining layer to expose the anode layer. The spacer layer is disposed at a position where a blocking wall is to be formed on the planarization layer in the isolation region. In this embodiment, the spacer layer 242 formed in the isolation region and the pixel defining layer 241 formed in the display region are disposed in the same layer and made of the same material. In the etching process, the height of the side of the spacer layer 242 away from the base relative to the surface of the planarization layer is greater than the height of the side of the pixel defining layer 241 away from the base relative to the surface of the planarization layer, thereby supporting the encapsulation layer of the display panel.

Next, an inorganic material layer is formed on the acquired structure.

Figure 5:
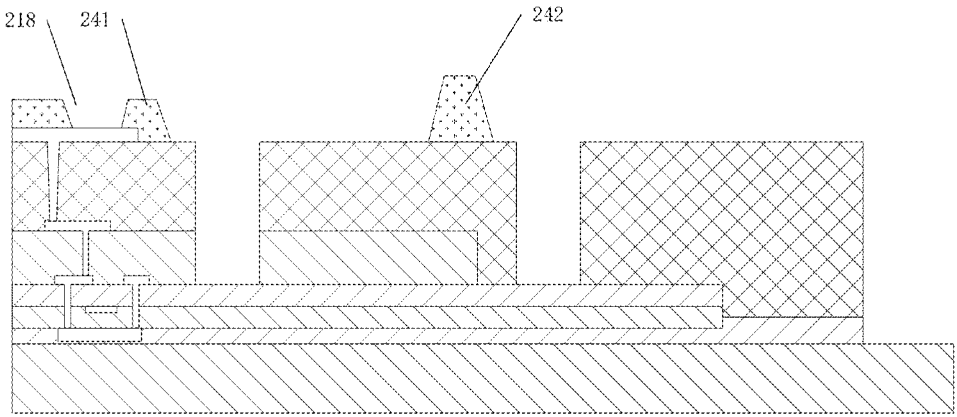
FIG. 5 shows a schematic structural diagram of an intermediate structure formed by related steps of a method for manufacturing a display panel according to some embodiments of the present disclosure.
Figure 6:
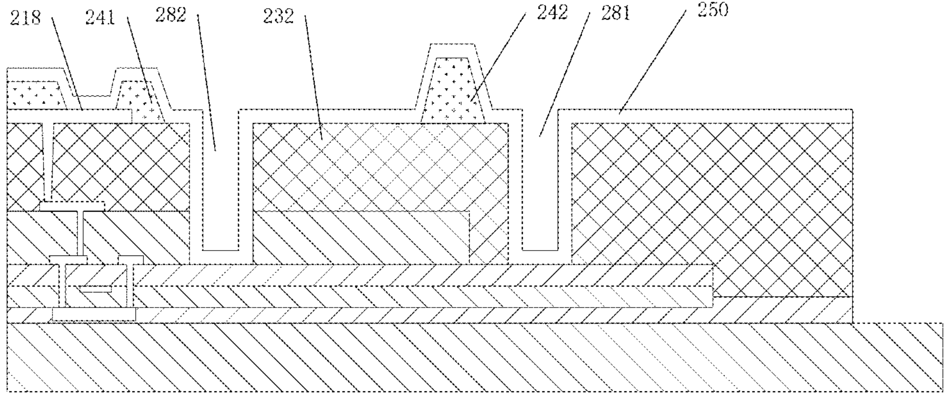
FIG. 6 shows a schematic structural diagram of an intermediate structure formed by related steps of a method for manufacturing a display panel according to some embodiments of the present disclosure.

The inorganic material layer is formed on the surface of the structure shown in FIG. 5 by deposition. The inorganic material layer covers the pixel defining layer 241 and the exposed anode layer 218, the planarization layer 232 and the spacer layer 242. In an embodiment, in the case that the grooves 2811 and 2821 are formed in the planarization layer, the inorganic material layer is formed at the bottoms and side walls of the grooves 2811 and 2821, and a fourth blocking groove 281 and a fifth groove 282 whose surfaces are covered with the inorganic material layer are obtained. The inorganic material layer formed in the grooves protects the functional layer thereunder from being eroded by water and oxygen components in subsequent processes, which can improve the yield of the display panel, ensure the quality of the display panel, and prolong the service life of the display panel. The acquired structure is as shown in FIG. 6. The material of the inorganic material layer is selected from one or more of $SiN_x$, $SiO_x$, SiON, $Al_2O_3$. In this embodiment, the inorganic material layer is a $SiN_x$ layer.

Next, the inorganic material layer is patterned to remove the inorganic material layer in the opening region and at a position where the blocking groove is to be formed.

The inorganic material layer is patterned to remove the inorganic material layer formed in the opening of the pixel defining layer, thereby exposing the anode layer 218 in the opening, such that a light-emitting material layer can be formed on the anode layer in the subsequent process. The openings 2711, 2721 and 2731 are respectively formed at the positions where the first blocking groove, the second blocking groove and the third blocking groove are to be formed in the inorganic material layer by patterning, and the acquired structure is as shown in FIG. 7.

Subsequently, a photoresist is applied to the acquired structure and the acquired structure is etched to form a blocking wall and a first blocking groove in the isolation region, and the photoresist is stripped.

Figure 7:
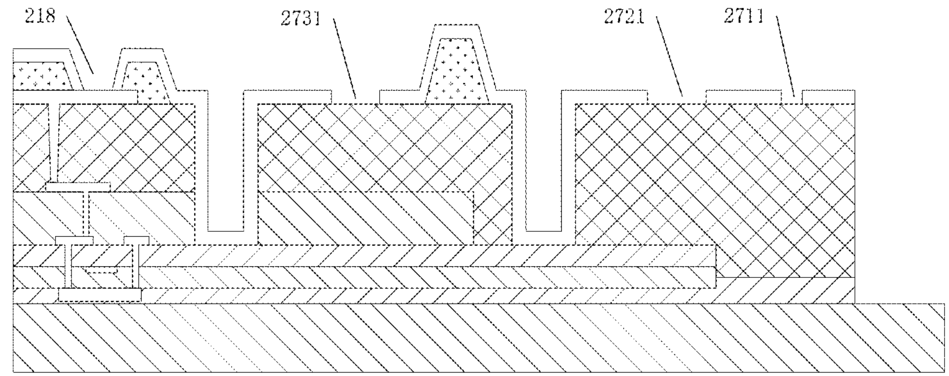
FIG. 7 shows a schematic structural diagram of an intermediate structure formed by related steps of a method for manufacturing a display panel according to some embodiments of the present disclosure.

A photoresist is coated on the acquired structure shown in FIG. 7, and a developing process is performed to remove the photoresist at the openings 2711, 2721, and 2731. The photoresist is used as a mask to wet etch the planarization layer under the openings to form a plurality of blocking grooves in the planarization layer.

In an embodiment, the planarization layer is over-etched using the $SiN_x$ inorganic material layer as a hard mask, such that the planarization layer under the inorganic material layer forms an undercut structure, that is, an orthographic projection of the planarization layer on the base is within an orthographic projection of the inorganic material layer on the base. In this way, the obtained blocking wall and the blocking groove formed in the planarization layer have a better film layer cut-off function.

In an embodiment, the first planarization layer is used as an etching stop layer to corrode the second planarization layer using an etching solution, and a third blocking groove 273 penetrating through the second planarization layer and taking the first planarization layer as a bottom can be obtained, thereby obtaining a second blocking wall 262 including the first planarization layer, the second planarization layer, the spacer layer 242 and the inorganic material layer thereon. In an embodiment, by controlling the etching duration or by selecting an etching solution, a second blocking groove 272 penetrating through the second planarization layer and taking the interlayer insulating layer as a bottom can be obtained, thereby obtaining a blocking wall which is formed between the second blocking groove 272 and the fourth blocking groove 281 and includes the second planarization layer and the inorganic material layer. In an embodiment, by controlling the etching duration, a first blocking groove 271 formed in the second planarization layer can be obtained, thereby obtaining a first blocking wall 261 including the second planarization layer and the inorganic material layer.

After the blocking grooves are formed, in an embodiment of the present disclosure, the photoresist on the surface of the structure is removed by using a stripping solution to complete the preparation of the blocking walls and the blocking grooves, thereby obtaining the display panel as shown in FIG. 2 according to the present disclosure. In the structure of the display panel of the present disclosure, the black pixel defining layer and the black spacer layer are formed under the inorganic material layer, which makes the stripping process in which the stripping solution is used possible.

According to the method for manufacturing the display panel in the present disclosure, by changing the manufacturing flow in the related art, the pixel defining layer and the spacer layer made of the opaque organic material are formed on the planarization layer prior to the inorganic material layer, and then the inorganic material layer covering the pixel defining layer and the spacer layer is formed, such that the pixel defining layer and the spacer layer made of the opaque organic material which is sensitive to the stripping solution, such as the black pixel defining layer and the black spacer layer, are protected by the inorganic material layer, thereby improving the chemical resistance of the display panel. Therefore, an OLED product suitable for the COE technology can be provided, which solves the problem that the contrast of the display panel under the ambient light is affected by the increase of the screen reflectivity in the dark state caused by the COE technology. Furthermore, since the spacer layer having a height higher than the height of the pixel defining layer is also protected by the inorganic material layer, the spacer layer is prevented from being affected in subsequent processes.

For the problems in the related art, the present disclosure provides a display panel, a display device, and a method for manufacturing the display panel. In some embodiments of the present disclosure, an inorganic material layer is disposed on sides, away from the base, of the pixel defining layer and the spacer layer to protect the pixel defining layer and the spacer layer from being affected by subsequent process steps and the preparation process of a light-emitting material, thereby effectively improving the yield of the product, especially the display panel adopting the COE technology. Furthermore, a plurality of types of blocking grooves and blocking walls are disposed in the isolation region to separate the display region from the hole region, such that a narrow border design and a special-shaped design can be achieved, and a wider application range and a higher application value can be achieved. The inorganic material layer is formed in the blocking grooves to protect each functional film layer from being affected by the intrusion of water and oxygen, thereby ensuring an encapsulation effect of the display panel, and further improving the product yield on the basis of effective encapsulation, which has an actual application value.

Obviously, the above embodiments of the present disclosure are merely examples for the purpose of clearly illustrating the present disclosure, and are not intended to limit the embodiments of the present disclosure. On the basis of the above descriptions, ordinary persons in the field may make other different forms of changes or variations, and it is not possible herein to exhaust all the embodiments. All obvious changes or variations derived from the technical solutions of the present disclosure are still within the protection scope of the present disclosure.

The invention claimed is:

1. A display panel, comprising:

a base provided with a display region, a hole region, and an isolation region disposed between the display region and the hole region, the display region and the isolation region at least partially surrounding the hole region;

the display panel comprising:

a planarization layer disposed on the base, a pixel defining layer and a spacer layer which are disposed on the planarization layer, and an inorganic material layer covering the planarization layer, the pixel defining layer and the spacer layer;

wherein the isolation region is provided with at least one blocking groove and at least one blocking wall, wherein the blocking groove is formed in the planarization layer, and the blocking wall comprises the planarization layer and the inorganic material layer formed on the planarization layer, wherein the blocking groove comprises a first blocking groove and a second blocking groove;

wherein the inorganic material layer covers a surface of the second blocking groove and has a hollow at the first blocking groove.

2. The display panel according to claim 1, wherein the planarization layer comprises a first planarization layer and a second planarization layer that are stacked, wherein at least one first blocking groove penetrates through the second planarization layer.

3. The display panel according to claim 2, wherein the pixel defining layer and the spacer layer are disposed in a same layer and are made of a same material, and in a direction perpendicular to a surface of the base, a thickness of the pixel defining layer is less than a thickness of the spacer layer.

4. The display panel according to claim 2, wherein in constituent structures of the blocking wall, an orthographic projection of the planarization layer on the base is within an orthographic projection of the inorganic material layer on the base.

5. The display panel according to claim 4, wherein the blocking wall comprises a first blocking wall; wherein the first blocking wall is disposed between the first blocking groove and the second blocking groove, and covers an edge of a side, close to the hole region, of the second planarization layer.

6. The display panel according to claim 4, wherein at least one of a side surface of the blocking wall facing the display region and a side surface of the blocking wall facing away from the display region is a curved surface recessed towards a center of the blocking wall.

7. The display panel according to claim 2, comprising a plurality of blocking walls, wherein surfaces of the plurality of blocking walls away from the base have a same height relative to the base.

8. The display panel according to claim 2, wherein the display panel further comprises an anode layer disposed on the planarization layer, wherein the pixel defining layer and the inorganic material layer are provided with openings in the display region for exposing the anode layer in the openings;

the display panel comprises a gate, a source and a drain which are disposed on the base, and the isolation region is provided with at least one of a first metal wiring layer which is disposed in a same layer as the gate and a second metal wiring layer which is disposed in a same layer as the source and the drain, wherein an orthographic projection of the first planarization layer on the base covers an orthographic projection of at least one of the first metal wiring layer and the second metal wiring layer on the base.

9. The display panel according to claim 1, wherein the pixel defining layer and the spacer layer are made of an opaque material.

10. The display panel according to claim 1, wherein the inorganic material layer is made of one or more of $SiN_x$, $SiO_x$, SiON, and $Al_2O_3$.

11. A method for manufacturing a display panel, comprising:

forming a pixel defining layer and a spacer layer on a planarization layer disposed on a base;

forming an inorganic material layer on the acquired structure;

patterning the inorganic material layer to remove the inorganic material layer in an opening region and at a position where a blocking groove is to be formed; and etching the acquired structure to form a blocking wall and a first blocking groove in an isolation region, wherein etching the acquired structure to form the blocking wall and the first blocking groove in the isolation region comprises:

applying a photoresist to the acquired structure and etching the acquired structure to form the blocking wall and the first blocking groove in the isolation region, and stripping the photoresist, which comprises stripping the photoresist with a stripping solution.

12. The method according to claim 11, wherein the pixel defining layer and the spacer layer are made of an opaque material.

13. A display device, comprising a display panel;

wherein the display panel comprises:

a base provided with a display region, a hole region, and an isolation region disposed between the display region and the hole region, the display region and the isolation region at least partially surrounding the hole region;

the display panel comprising:

a planarization layer disposed on the base, a pixel defining layer and a spacer layer which are disposed on the planarization layer, and an inorganic material layer covering the planarization layer, the pixel defining layer and the spacer layer;

wherein the isolation region is provided with at least one blocking groove and at least one blocking wall, wherein the blocking groove is formed in the planarization layer, and the blocking wall comprises the planarization layer and the inorganic material layer formed on the planarization layer, wherein the blocking groove comprises a first blocking groove and a second blocking groove;

wherein the inorganic material layer covers a surface of the second blocking groove and has a hollow at the first blocking groove.

14. The display device according to claim 13, wherein the planarization layer comprises a first planarization layer and a second planarization layer that are stacked, wherein at least one first blocking groove penetrates through the second planarization layer.

15. The display device according to claim 14, wherein the pixel defining layer and the spacer layer are disposed in a same layer and are made of a same material, and in a direction perpendicular to a surface of the base, a thickness of the pixel defining layer is less than a thickness of the spacer layer.

16. The display device according to claim 14, wherein in constituent structures of the blocking wall, an orthographic projection of the planarization layer on the base is within an orthographic projection of the inorganic material layer on the base.

17. The display device according to claim 13, wherein the pixel defining layer and the spacer layer are made of an opaque material.

* * * * *